United States Patent [19]
Kaiserswerth

[11] 3,962,550
[45] June 8, 1976

[54] JOINT SEALS FOR ELECTROMAGNETIC WAVE SHIELDS

[75] Inventor: Hans-Peter Kaiserswerth, Regensburg, Germany

[73] Assignee: Siemens Aktiengesellschaft, Berlin and Munich, Germany

[22] Filed: July 12, 1973

[21] Appl. No.: 378,716

[30] Foreign Application Priority Data
July 18, 1972 Germany............................ 2235216

[52] U.S. Cl............... 174/35 GC; 174/35 MS; 277/236
[51] Int. Cl.² .................................... H05K 9/00
[58] Field of Search............... 174/35 MS, 35 GC; 277/236, 235 R

[56] References Cited
UNITED STATES PATENTS
| | | | |
|---|---|---|---|
| 1,765,443 | 1/1930 | Peterson.......................... | 174/35 GC |
| 3,304,360 | 2/1967 | Hadley et al.................. | 174/35 GC |

FOREIGN PATENTS OR APPLICATIONS
| | | | |
|---|---|---|---|
| 31,578 | 12/1956 | Germany........................ | 174/35 GC |
| 1,002,816 | 2/1957 | Germany........................ | 174/35 GC |
| 1,035,219 | 7/1958 | Germany........................ | 174/35 GC |

*Primary Examiner*—Darrell L. Clay
*Attorney, Agent, or Firm*—Hill, Gross, Simpson, Van Santen, Steadman, Chiara & Simpson

[57] ABSTRACT

Joints in electromagnetic wave shields, such as between access doors and the door frames of the shield housings or jackets are electrically bridged by means of contact springs which are generally V-cross-section having base portions clamped at one side of the joint and provide contact edges which engage in efficient electrical contact with the opposite side of the joint. Advantageous construction, insulation and attachment of the clamps for the springs are provided for. Improved functioning of the sealing spring system is attained by use of soft magnetic material in the clamps, in association with the clamps, or in connection with the joint profile structure.

8 Claims, 5 Drawing Figures

JOINT SEALS FOR ELECTROMAGNETIC WAVE SHIELDS

This invention relates to improvements in joint seals for electromagnetic wave shields, and is more particularly concerned with protecting the joints at closure openings against electromagnetic leakage.

Shield jackets or housings for electromagnetic space shielding generally have access openings closed by panel doors set in door frames, the frames being tightly connected to the shield jacket in each instance.

The necessary clearances between the door and the door frame have been electrically bridged by means of contact springs. High mechanical and particularly electrical demands are made on these springs since they are critical to the shielding characteristics of the jacket about the enclosed space. Examples of prior bridging spring arrangements are present in German Patents Nos. 1,035,219 and 1,064,119 relating to generally S- or Z- shaped structures. However, such arrangements have only provided satisfactory results where the clearance or gap width is below 10mm.

An important object of the present invention is to overcome the foregoing and other disadvantages, deficiencies, inefficiencies, shortcomings and problems in prior arrangements for sealing of joints in electromagnetic wave shields, and the like, and to attain important advantages and new and improved results as will hereinafter become apparent.

Another object of the invention is to provide new and improved joint bridging and sealing means especially suitable for electromagnetic space shields and particularly suitable for gaps wherein the spacing is larger than 10 mm.

A further object of the invention is to provide a space shield joint seal providing improved shield damping Still another object of the invention is to provide a new and improved contact spring arrangement for electromagnetic wave shield joints.

Other objects, features and advantages of the invention will be readily apparent from the following description of certain preferred embodiments thereof, taken in conjunction with the accompanying drawing although variations and modifications may be effected without departing from the spirit and scope of the novel concepts embodied in the disclosure, and in which.

Figure 1:
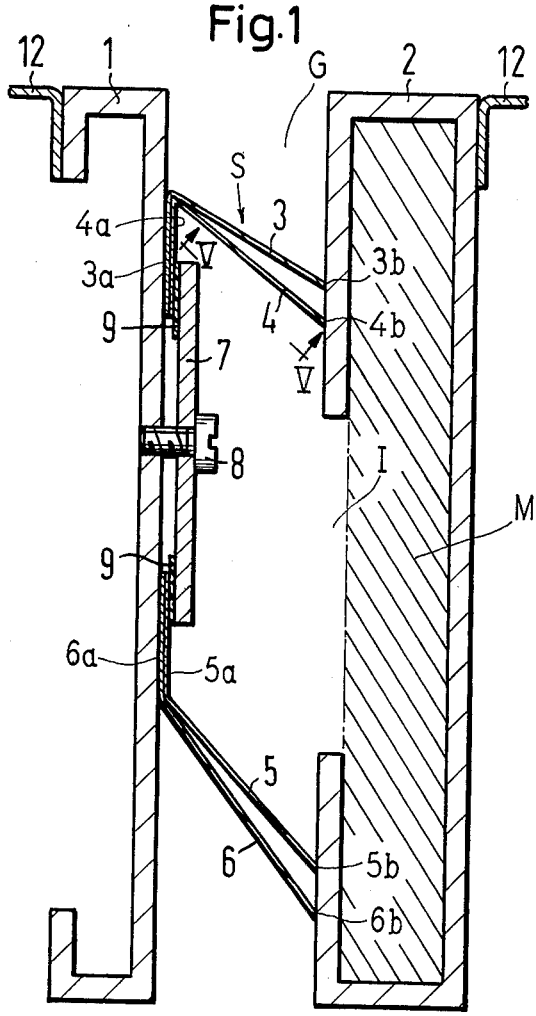
FIG. 1 is a fragmentary sectional view illustrative of one embodiment of the invention.

In a preferred embodiment of the invention as shown in FIG. 1, a joint seal S is provided within a clearance space or gap G between profile members 1 and 2 defining therebetween a joint in an electromagnetic wave shield jacket 12. Not only the members 1 and 2 but also the shield jacket 12 are made from suitable electrically conductive material such as metal, and the members 1 and 2 may be in the form of suitably profiled extrusions wherein the member 1 is carried by an access door providing a closure for an opening about which the member 2 provides a door frame. As will be observed, the members 1 and 2 are in tight contact with the panels of the housing or shield 12.

According to the present invention, the seal S comrises two contact spring assemblies, one of which has companion spring strips 3 and 4 and the other of which has companion spring strips 5 and 6, the spring strips extending along the length of the members 1 and 2 within and bridging the gap G. In this instance both of the spring assemblies are mounted in firm electrical contact with the member 1 and have free ends biased to effect positive, self-cleaning electrical contact with the member 2. To this end the springs are angularly shaped in cross section such that the springs 3 and 4 have base flanges 3a and 4a which are nested together in laminar relation and seated in electrically contacting relation against the opposing face of the member 1. Likewise, the springs 5 and 6 have base flanges 5a and 6a, respectively, which are nested in laminar relation and seated against the opposing face of the member 1.

Firm electrical engagement of the spring assemblies 3, 4 and 5, 6 with the member 1 is effected by means of a clamp 7. For this purpose, the base flanges 3a, 4a project toward the base flanges 5a, 6a in spaced relation with the clamp 7 in the form of a plate or strip preferably coextensive with the extent of the base flanges along the member 1 and with the clamps securely fastened to the member 1 as by means of a screw 8 which thrusts the clamp into clamping engagement with the spring base flanges. At its points of contact with the spring base flanges, the clamp 7 is electrically insulated as by means of insulating strips 9 interposed between the clamp and the base flanges 4a and 5a against which the clamp thrusts and thereby firmly clamps these spring base flanges against the companion base flanges 3a and 6a which are thus thrust into firm bearing electrical contact with the member 1. The insulation 9 prevents an electric current path between the two spring assemblies through the clamp 7, which would decrease damping resistance. From their base flanges, the springs 3 and 4 project diagonally under spring bias toward and into engagement with their free edges with the member 2. Such engagement is improved and the intended electromagnetic damping effect of the springs is improved by having the springs of differential length so that for engagement with the member 2 the springs will assume a generally V-shaped relationship diverging from the angular junctures of the leg-like body portions of the springs with their base flanges. The oblique extent of the springs 3, 4 and 5, 6 between the members 1 and 2 provides for excellent adaptability for variables in spacings between the members 1 and 2 in respect to the gap G because the springs can be normally extended to a distance from the member 1 which is slightly greater than the widest expected spacing for the gap G but because of their resilience the springs will deflect and compensate for narrower spacings. Also, by the spring bias, assurance is had that the free edges of the springs will, in effect, bite firmly against the engaged surfaces of the member 2 to provide excellent electrical contact and to work through any surface obstruction such as oxide which might impair electrical contact between the springs and the engaged surfaces of the member 2.

Apparent electrical resistance between the contact surfaces of the springs 3, 4 and 5, 6 is increased by a gap or interruption I between those portions of the surfaces of the member 2 engaged by the respective spring assemblies. A further increase in the apparent electrical resistance can be achieved by having the member 2 formed from a soft magnetic material. On the other hand, the increase in apparent electrical resistance can be attained by filling the hollow space within the profile of the member 2 with a soft magnetic material M. By thus increasing the high frequency resistance between the points of contact of the two spring assemblies with the member 2, excellent results are obtained where the spring assemblies are mounted on a common surface of the member 1.

Figure 2:
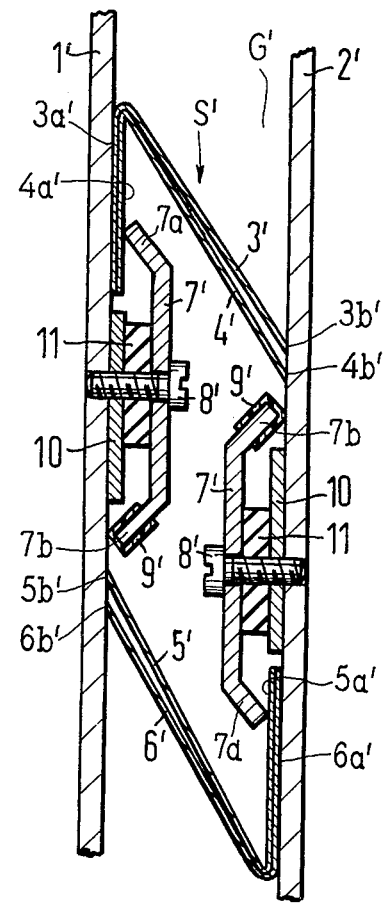
FIG. 2 is a fragmentary sectional view illustrating another embodiment of the invention.

In the embodiment of the invention as shown in FIG. 2, optimum electromagnetic shielding damping is achieved by having the joint sealing spring assemblies mounted on the respective alternately opposite members defining a joint in the shield housing or jacket. It will be understood that the members 1' and 2' between which the spacing gap G' is sealed by the spring system S' will be in thoroughly sealed electrical engagement with the housing or jacket, similarly as it true with respect to the housing 12 in FIG. 1 having regard to the confronting spaced members 1 and 2 in that figure. In the FIG. 2 form of the invention, simplification is effected in respect to the construction of the spring assemblies 3', 4' and 5', and 6' because each of these spring assemblies can be made identically and merely reversed with respect to one another, as contrasted to the respective spring assemblies in FIG. 1 where the juncture between base flange terminals and body portions of one of the assemblies 3, 4 must be at an acute included angle, while the other of the spring assemblies 5, 6 must be formed with an obtuse included angle between the base flange terminals and the body portions of the springs. In FIG. 2 both of the spring assemblies 3', 4' and 5', 6' are provided with preferably identical included angularity between the body portions of the springs and the base flange portions.

As shown in FIG. 2, one of the spring assemblies, herein the assembly 3', 4' has the face-to-face laminar base flanges 3a', 4a' clamped against the member 1' while the spring assembly 5', 6' has the laminar base flanges 5a', 6a' clamped against the member 2'. In each instance the base flanges are clamped by the clamping plate or strip 7' which in this instance has a marginal terminal flange 7a directed angularly from the body of the clamp and in direct engagement with the base flanges of the associated spring assembly, in this instance the base flanges 4a' and 5a', whereby by securing the clamps to the respective members 1' and 2' by means of the screws 8' the spring base flanges are firmly electrically engaged with the respective members 1' and 2'. Further, the opposite terminal edges of the clamps 7' are provided with angular terminal flanges 7b directed toward the respective member 1' or 2' to which the clamp is attached. In this instance only the terminal flanges 7b need be insulated by means of the insulation 9'. However, there is preferably provided a ferromagnetic, i.e. soft magnet piece or strip 10 in the hollow space formed between each of the clamps 7' and the contact profile provided by the members 1' and 2', with a resilient dielectric pressure pad 11 pressed by the clamp 7' against the piece 10 which in turn is thereby pressed against the member 1' or 2', as the case may be. From the juncture bend connections with the base flanges, the spring members 3' and 4' on the one hand, and 5' and 6' on the other hand, extend diagonally as divergently V-shape legs of different length into engagement at their free edges at spaced points in sealing, electrical contact with the member 1' in respect to the springs 5' and 6' and the member 2' in respect to the spring 3' and 4'.

In both of the arrangements shown in FIGS. 1 and 2, an advantageous result is attained from the pressure of the retaining clamp 7 or 7' lowering the transfer resistance at the contact surfaces between the springs and the profile member against which clamped. Insulation of the retaining clamp in each instance assures that no additional electrical current path is connected in parallel. If the retaining clamp 7 or 7' is made of soft magnetic material, an increase of the apparent resistance of the current path between the contact springs is provided by the retaining clamp. Where the magnetic insert 10 (FIG. 2) is arranged between the clamp 7' and the member 1' and 2' an advantage is attained in that the material of the retaining clamp can be chosen according to desirable stability parameters and the increase in apparent resistance results from the soft magnetic insert the material of which can be chosen entirely for its electrical characteristics, such for example as a relatively weak or not very solid ferrite material.

Figure 5:
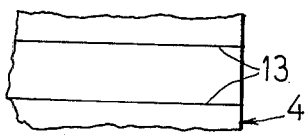
FIG. 5 is a fragmentary plan view taken substantially in the plane of line V—V of FIG. 1.

Additional shielding effect can be obtained by slitting the spring sheet or strip metal of the confronting members of the spring assembly and which face generally toward the clamps. For example, the springs 4 and 5 in FIG. 1 or the springs 4' and 5' in FIG. 2 may have the body or leg portions slit transversely starting at their free edge terminals 4b, 5b, 4b', 5b', respectively, exemplified in FIG. 5 where the spring 4 is shown provided with slits 13. The remaining springs 3, 6, 3' and 6' need not have the body or leg portions slit in from their free edge terminals 3b, 6b, 3b', 6b', respectively.

In a preferred form, the insulation 9 and 9' comprises an electrically insulating adhesive tape. This kind of insulation is particularly simple and time saving in application. If preferred, however, any other suitable insulating material may be used, a suggested form of which may be a suitable lacquer.

Figure 3:
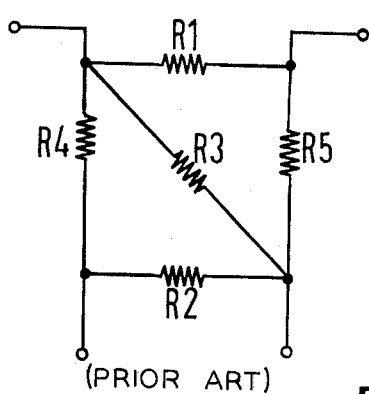
FIG. 3 is a schematic diagram representing magnetic sealing effect according to the prior art.
Figure 4:
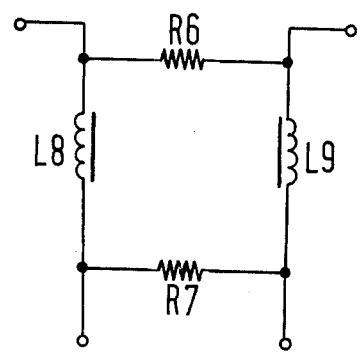
FIG. 4 is a schematic diagram demonstrating the improved electrical characteristics of the arrangements according to the present invention.

By way of comparison of the improved results attained by the present invention as compared to prior art arrangements, FIG. 3 shows a simplified diagram of results attained by the prior art while FIG. 4 shows the results attained by use of the present invention wherein the clamps are insulated at least in part. Thus, in FIG. 3 the resistances R1, R2 and R3 represents a S- or Z-shaped contact spring sealing arrangement. The resistances R4 or R5, respectively, represent the electrical resistance of the profile pieces or members defining a joint gap across with the S- or Z-shaped springs extend and make contact on the respective profiles. It will be observed that by virtue of the resistance 3 an electrical current can flow diagonally across the square loop in which the resistances R1 and R2 as well as R4 and R5 provide respective sides.

On the other hand, in FIG. 4 the resistances R6 and R7 represent the free body legs of the V-related electrically conductive contact springs of the sealing spring assemblies according to the present invention. The inductors L8 and L9 represent the electrical apparent resistance between the, in effect, three-point contact provided by the spring assemblies and the clamping means for the springs on the respective profile members at the sealed joint and wherein an increased apparent resistance may occur through the suitable choice of materials or shaping of the profiles. It becomes immediately apparent that there is no diagonal resistance in the square loop provided by the resistances R6 and R7 and the inductors L8 and L9. Comparisons between reasonably equivalent structures according to the prior art and structures according to the present invention have resulted in an improvement according to the present invention by a factor of about 100 even though considerably wider joint gaps have been scaled in electromagnetic wave shields.

It will be understood that variations and modifications may be effected without departing from the spirit and scope of the novel concepts of this invention.

I claim as my invention:

1. In a construction for shielding against electromagnetic wave conduction,
   a. a pair of adjacent relatively movable electrically conductive shield members having a space therebetween, and
   b. a seal limiting leakage of radio-frequency signals through said space, said seal comprising:
      1. two conductive elongated spaced contact spring assemblies having a V-shaped cross-section, one leg of each of said assemblies having a base portion disposed in electrical engagement with one of said members, and the other leg of the assemblies being a freely deflectable spring portion having an edge biased against the other of said members and in electrical engagement therewith;
      2. at least one clamp secured to said one member between said spring assemblies and holding the base portions against said one member; and
      3. electrical insulation disposed between the engaging points on said clamp and said base portions and insulating said clamp from said assemblies.

2. A device according to claim 1, wherein the base portions of the spring assemblies are all in engagement with one of the members and the spring portions are all in engagement with the other of the members, said base portions projecting toward one another in spaced relation, said clamping means comprising a clamp extending between and engaging the base portions of both of the spring assemblies, securing means securing the clamp to the member engaged by both of the base portions, and said insulation being located between the clamp and both of the base portions.

3. A device according to claim 2, wherein said other member is hollow and has a gap therein between portions thereof electrically contacted by said spring portions, and a filler of ferro magnetic material within said hollow member.

4. A device according to claim 1, wherein said insulation comprises adhesively applied insulating tape.

5. An electromagnetic wave shield joint including a pair of spaced electrically conductive members, and means for sealing the gap between said members, said sealing means comprising:
   a. a pair of conductive spring assemblies having terminal base portions engaging one of the members and opposite free end terminal edges engaging the other of the members, respectively;
   b. clamping means securing the respective terminal base portions to the member contacted thereby;
   c. the terminal base portions of the spring assemblies all being in engagement with one of the members and the terminal edges all being in engagement with the other of the members;
   d. said terminal base portions projecting toward one another in spaced relation;
   e. said clamping means comprising a clamp extending between and engaging the terminal base portions of both of the spring assemblies;
   f. means securing the clamp to the member engaged by both of the terminal base portions; and
   g. insulating means disposed between the clamp and the terminal base portions and insulating said clamping means from said spring assemblies.

6. A joint according to claim 5, wherein said other of the members is hollow and has a gap therein between areas thereof engaged by said terminal tips, and a filler of ferromagnetic material within said hollow member.

7. A joint according to claim 5, wherein said terminal edge of each of the clamps has adhesively applied insulating tape comprising said insulation.

8. An electromagnetic wave shield joint defined by spaced electrically conductive members and means sealing the gap between the members in the joint, said sealing means comprising:
   a. a pair of conductive spring assemblies having terminal base portions engaging one of the members and opposite free end terminal edges engaging the other of the members, respectively;
   b. clamping means securing the respective terminal base portions to the member contacted thereby;
   c. said other of the members being hollow and having a gap therein between portions thereof engaged by said terminal edges;
   d. a filler of ferromagnetic material within said hollow member filling the member and extending across the gap; and
   e. insulating means disposed between said clamping means and the terminal base portions of the spring assemblies and insulating said clamping means from said spring assemblies.

* * * * *